United States Patent
Lee et al.

(10) Patent No.: US 9,246,137 B2
(45) Date of Patent: Jan. 26, 2016

(54) METHOD OF FABRICATING LIGHT EXTRACTION SUBSTRATE FOR OLED

(71) Applicant: Samsung Corning Precision Materials Co., Ltd., Gyeongsangbuk-do (KR)

(72) Inventors: Joo Young Lee, ChungCheongNam-Do (KR); Eun Ho Choi, ChungCheongNam-Do (KR); Hyunhee Lee, ChungCheongNam-Do (KR)

(73) Assignee: Corning Precision Materials Co., Ltd. (KR)

( * ) Notice: Subject to any disclaimer, the term of this patent is extended or adjusted under 35 U.S.C. 154(b) by 81 days.

(21) Appl. No.: 14/268,291

(22) Filed: May 2, 2014

(65) Prior Publication Data

US 2014/0329004 A1 Nov. 6, 2014

(30) Foreign Application Priority Data

May 6, 2013 (KR) .......................... 10-2013-0050549

(51) Int. Cl.
*H01L 51/56* (2006.01)
*B05D 5/00* (2006.01)
*C03C 17/00* (2006.01)
*H01L 51/52* (2006.01)

(52) U.S. Cl.
CPC *H01L 51/56* (2013.01); *B05D 5/00* (2013.01); *C03C 17/007* (2013.01); *C03C 2217/45* (2013.01); *C03C 2217/475* (2013.01); *H01L 51/5268* (2013.01)

(58) Field of Classification Search
CPC ...................................................... H01L 51/56
See application file for complete search history.

(56) References Cited

U.S. PATENT DOCUMENTS

2012/0206675 A1* 8/2012 Seo ...................... H01L 27/3211
349/96
2012/0241727 A1* 9/2012 Ogita ...................... C09K 11/06
257/40

FOREIGN PATENT DOCUMENTS

JP 2008-026883 * 2/2008

* cited by examiner

*Primary Examiner* — Nathan T Leong
(74) *Attorney, Agent, or Firm* — Lerner, David, Littenberg, Krumholz & Mentlik, LLP

(57) ABSTRACT

A method of fabricating a light extraction substrate for an OLE) by which the flatness of the light extraction substrate for an OLED can be increased. Particles of a first metal oxide and a sol of a second metal oxide are inputted and mixed into an organic solvent. A base substrate is coated with a mixture of the first and second metal oxides and the organic solvent. A resultant coating film on the base substrate is heat-treated. The coating film is coated with the second metal oxide to form a metal oxide thin film on the base substrate. In the metal oxide thin film, the particles of the first metal oxide are impregnated in a matrix of the second metal oxide.

12 Claims, 7 Drawing Sheets

METHOD OF FABRICATING LIGHT EXTRACTION SUBSTRATE FOR OLED

CROSS REFERENCE TO RELATED APPLICATION

The present application claims priority from Korean Patent Application Number 10-2013-0050549 filed on May 6, 2013, the entire contents of which are incorporated herein for all purposes by this reference.

BACKGROUND OF THE INVENTION

1. Field of the Invention

The present invention relates to a light extraction substrate for an organic light-emitting device (OLED), and more particularly, to a method of fabricating a light extraction substrate for an OLED by which the flatness of the light extraction substrate for an OLED can be increased.

2. Description of Related Art

In general, an organic light-emitting device (OLED) includes an anode, a light-emitting layer and a cathode. When a voltage is applied between the anode and the cathode, holes are injected from the anode into a hole injection layer and then migrate from the hole injection layer through a hole transport layer to the organic light-emitting layer, and electrons are injected from the cathode into an electron injection layer and then migrate from the electron injection layer through an electron transport layer to the light-emitting layer. Holes and electrons that are injected into the light-emitting layer recombine with each other in the light-emitting layer, thereby generating excitons. When such excitons transit from the excited state to the ground state, light is emitted.

Organic light-emitting displays including an OLED are divided into a passive matrix type and an active matrix type depending on the mechanism that drives the N*M number of pixels which are arranged in the shape of a matrix.

In an active matrix type, a pixel electrode which defines a light-emitting area and a unit pixel driving circuit which applies a current or voltage to the pixel electrode are positioned in a unit pixel area. The unit pixel driving circuit has at least two thin-film transistors (TFTs) and one capacitor. Due to this configuration, the unit pixel driving circuit can supply a constant current irrespective of the number of pixels, thereby realizing uniform luminance. The active matrix type organic light-emitting display consumes little power, and thus can be advantageously applied to high definition displays and large displays.

However, as shown in FIG. 8, only about 20% of light generated by an OLED is emitted to the outside and about 80% of the light is lost by a waveguide effect originating from the difference in the refractive index between a glass substrate 10 and an organic light-emitting layer 30 which includes an anode 20, a hole injection layer, a hole transport layer, a light-emitting layer, an electron transport layer and an electron injection layer and by a total internal reflection originating from the difference in the refractive index between the glass substrate 10 and the air. Specifically, the refractive index of the internal organic light-emitting layer 30 ranges from 1.7 to 1.8, whereas the refractive index of indium tin oxide (ITO) which is generally used for the anode 20 ranges from 1.9 to 2.0. Since the two layers have a very small thickness ranging from 100 to 400 nm and the refractive index of glass used for the glass substrate 10 is about 1.5, a planar waveguide is thereby formed inside the OLED. It is calculated that the ratio of the light lost in the internal waveguide mode due to the above-described reason is about 45%. In addition, since the refractive index of the glass substrate 10 is about 1.5 and the refractive index of the ambient air is 1.0, when the light is directed outward from the inside of the glass substrate 10, a ray of the light having an angle of incidence greater than a critical angle is totally reflected and is trapped inside the glass substrate 10. Since the ratio of the trapped light is up to about 35%, only about 20% of the generated light is emitted to the outside. Herein, reference numerals 31, 32 and 33 indicate components of the organic light-emitting layer 30. Specifically, 31 indicates the hole injection layer and the hole transport layer, 32 indicates the light-emitting layer, and 33 indicates the electron injection layer and the electron transport layer.

The typical method for overcoming the problem of the light trapping was to increase external light extraction efficiency using a microlens array. However, the microlens array is easily damaged by external impacts or be contaminated by impurities since convex-concave portions of a light extraction layer protrude outward. When the microlens array is used in a display, it also has the problem of blurred images caused by lenses.

In addition, a light extraction layer which changes an optical waveguide path is provided between the glass substrate 10 and the anode 20 in order to increase internal light extraction. Such internal light extraction layer extracts light that would otherwise be lost by the waveguiding effect, and thus the possibility of increasing the internal light extraction efficiency is significantly higher than the possibility of increasing the external light extraction efficiency. In order to increase the light extraction efficiency of the internal light extraction layer, the surface of the light extraction layer must have a convex-concave structure. In this case, however, the anode 20 which adjoins to the light extraction layer must have a similar shape. This increases a danger in that the anode 20 has a localized sharp portion. When the anode 20 has a sharp protruding portion, the current is concentrated in the sharp portion. This consequently causes a leakage current or lowers the power efficiency.

In order to overcome this problem, several approaches were proposed in the related art, among which there was a method of impregnating light-scattering particles in a matrix material. This method includes properly mixing a matrix material and light-scattering particles and then coating the glass substrate 10 with a mixture of the matrix material and the light-scattering particles, for example, by spin coating or bar coating or using a slot die. When the matrix material is implemented as a metal oxide, a sol is also used. However, the use of the sol disadvantageously causes evaporation and/or loss in an organic matter included in the sol during drying and curing, thereby reducing the volume to a range from 1/10 to 1/20 of the thickness of a metal oxide thin film that is initially formed. In addition, since the light-scattering particles do not shrink during the drying or curing, the light-scattering particles protrude from the surface of the metal oxide thin film that is shrunk. This disadvantageously increases the surface roughness of the metal oxide thin film that is supposed to act as an internal light extraction layer that requires high flatness. The increased surface roughness of the metal oxide thin film has an adverse effect on the longevity of an OLED that uses the metal oxide thin film as an internal light extraction layer.

The information disclosed in the Background of the Invention section is provided only for or better understanding of the background of the invention, and should not be taken as an acknowledgment or any form of suggestion that this information forms a prior art that would already be known to a person skilled in the art.

RELATED ART DOCUMENT

Patent Document 1: Japanese Unexamined Patent Publication No. 2008-26883 (Feb. 7, 2008)

BRIEF SUMMARY OF THE INVENTION

Various aspects of the present invention provide a method of fabricating a light extraction substrate for an organic light-emitting device (OLED) by which the flatness of the light extraction substrate for an OLED can be increased.

In an aspect of the present invention, provided is a method of fabricating a light extraction substrate for an organic light-emitting device. The method includes the following steps of: inputting and mixing particles of a first metal oxide and a sol of a second metal oxide into an organic solvent; coating a base substrate with a mixture of the first and second metal oxides and the organic solvent; heat-treating a resultant coating film on the base substrate; and coating the coating film with the second metal oxide to form a metal oxide thin film on the base substrate, wherein, in the metal oxide thin film, the particles of the first metal oxide are impregnated in a matrix of the second metal oxide.

According to an embodiment of the present invention, the organic solution may be an ethanol solution in which a first organic matter and a second organic matter are included.

One of the first and second organic matters may be ethylene glycol (EG), and the other one of the first and second organic matters may be polyvinylphenol (PVP).

Here, the first metal oxide may be one selected from the group consisting of $ZnO$, $Al_2O_3$, $TiO_2$, $SnO_2$, $ZrO_2$ and $SiO_2$.

The step of mixing the first metal oxide and the second metal oxide into the organic solvent may include using the first metal oxide dispersed in ethanol.

The second metal oxide may be made of a material identical with or different from that of the first metal oxide.

Here, the second metal oxide may be one selected from the group consisting of $ZnO$, $Al_2O_3$, $TiO_2$, $SnO_2$, $ZrO_2$ and $SiO_2$.

In addition, the step of mixing the first metal oxide and the second metal oxide into the organic solvent may include mixing the first metal oxide, the sol of the second metal oxide and the organic solvent at a volumetric ratio of 1:1:2.

The step of coating the base substrate with the mixture of the first and second metal oxides and the organic solvent may include coating the base substrate with the mixture of the first and second metal oxides and the organic solvent by spin coating or bar coating.

The step of coating the coating film with the second metal oxide may include mixing the second metal oxide with an organic solvent and then coating the coating film with a mixture of the second metal oxide and the organic solvent.

Here, the step of coating the coating film with the second metal oxide may include coating the coating film with the second metal oxide by spin coating or bar coating.

In addition, the method may further include the step of drying the coating film before the step of heat-treating the resultant coating film on the base substrate.

According to embodiments of the present invention, the substrate is coated with the light-scattering particles and the sol using the organic matters through the two coating steps. This can consequently increase the dispersibility of the light-scattering particles and prevent the light-scattering particles from forming a bilayer, thereby increasing the flatness of the metal oxide thin film that coats the substrate. Accordingly, the fabricated metal oxide thin film can be applied not only as an external light extraction layer but also as an internal light extraction layer.

In addition, all of the organic matters are lost during curing, and thus do not act as a byproduct during the fabrication or operation of the OLED, thereby having no effect on the longevity of the OLED.

Furthermore, it is possible to improve the light extraction efficiency of the OLED and thus to operate the OLED at a low current, thereby increasing the longevity of the OLED.

The methods and apparatuses of the present invention have other features and advantages which will be apparent from, or are set forth in greater detail in the accompanying drawings, which are incorporated herein, and in the following Detailed Description of the Invention, which together serve to explain certain principles of the present invention.

DETAILED DESCRIPTION OF THE INVENTION

Reference will now be made in detail to a method of fabricating a light extraction substrate for an organic light-emitting device (OLED) according to the present invention, embodiments of which are illustrated in the accompanying drawings and described below, so that a person skilled in the art to which the present invention relates can easily put the present invention into practice.

Figure 1:
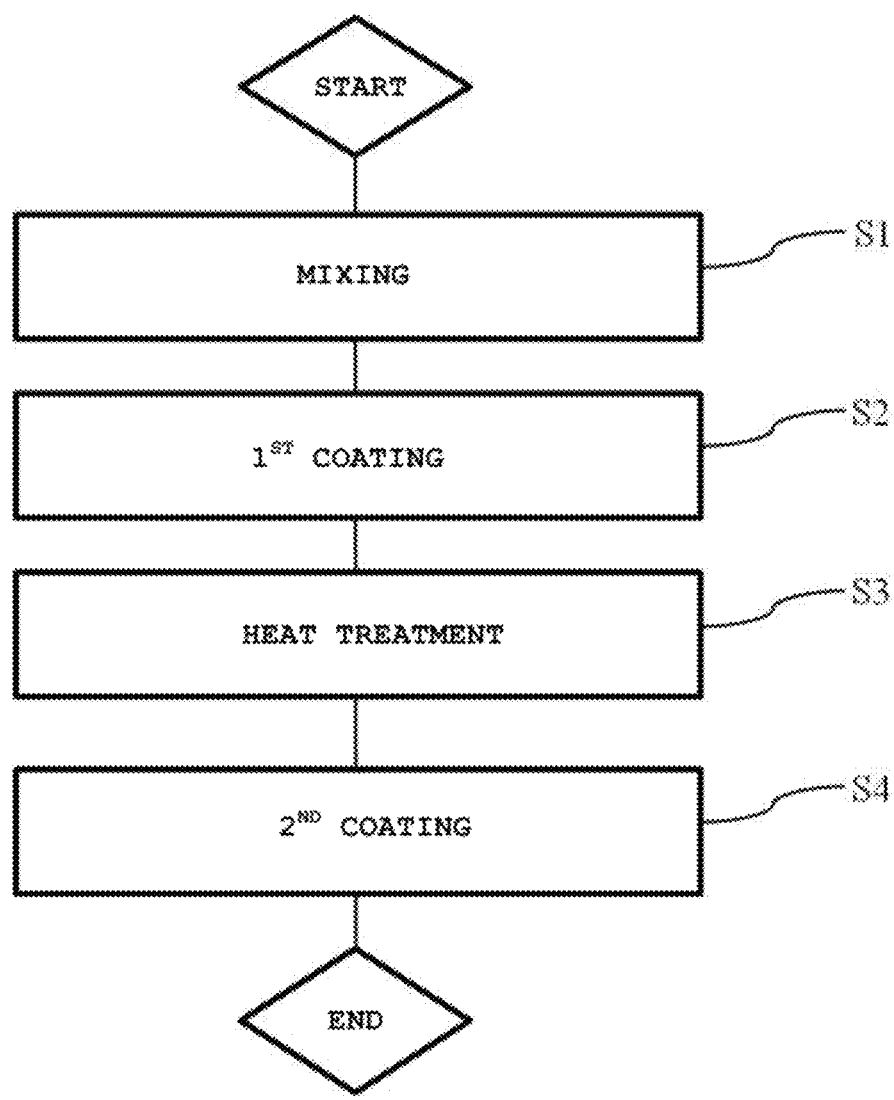
FIG. 1 is a process flowchart showing a method of fabricating a light extraction substrate for an organic light-emitting device (OLED) according to an embodiment of the present invention.
Figure 2:
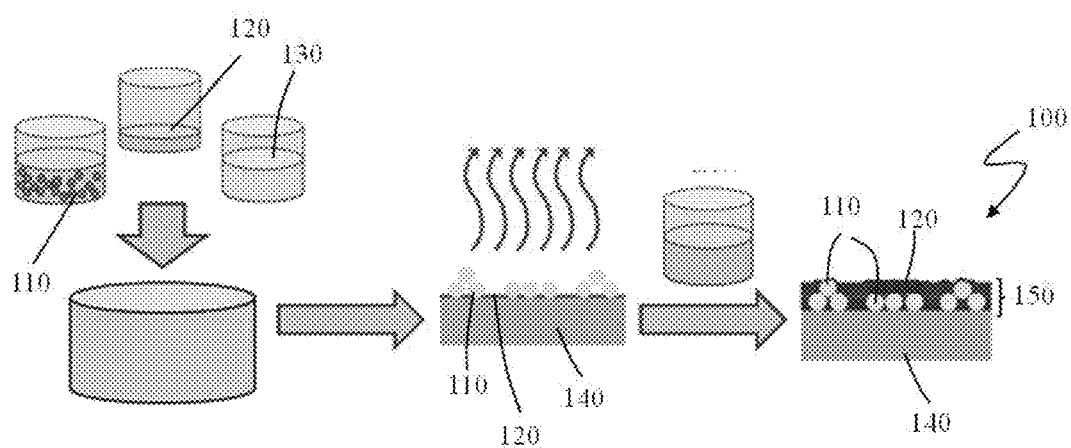
FIG. 2 is a process view schematically showing the method of fabricating a light extraction substrate for an OLED according to an embodiment of the present invention.

Throughout this document, reference should be made to the drawings, in which the same reference numerals and signs are used throughout the different drawings to designate the same or similar components. In the following description of the present invention, detailed descriptions of known functions and components incorporated herein will be omitted when they may make the subject matter of the present invention unclear.

As shown in FIG. 1 and FIG. 2, a method of fabricating a light extraction substrate for an OLED according to an exemplary embodiment of the present invention is intended to fabricate a substrate that is applied as an external or internal light extraction layer of an OLED. The method of fabricating a light extraction substrate for an OLED includes a mixing step S1, a first coating step S2, a heat treatment step S3 and a second coating step S4.

First, the mixing step S1 is the step of mixing first metal oxide 110, second metal oxide 120 and an organic solvent 130. At the mixing step S1, the first metal oxide 110 is prepared in the form of particles. The first metal oxide 110 can be implemented as one selected from among ZnO, $Al_2O_3$, $TiO_2$, $SnO_2$, $ZrO_2$ and $SiO_2$. In addition, at the mixing step S1, the first metal oxide 110 dispersed in ethanol can be mixed with the second metal oxide 120 and the organic solvent 130. For example, a dispersion of the first metal oxide 110 can consist of 80% of ethanol and 20% of the first metal oxide 110.

In addition, the mixing step S1 can use the second metal oxide 120 that is the same as or different from the first metal oxide 110. For instance, the second metal oxide 120 can be implemented as one selected from among ZnO, $Al_2O_3$, $TiO_2$, $SnO_2$, $ZrO_2$ and $SiO_2$. The second metal oxide 120 used at the mixing step S1 is a sol unlike the first metal oxide 110 that is in the form of particles. When a metal oxide thin film 150 is finally produced, the particles of the first metal oxide 110 act as light-scattering particles, and the second metal oxide 120 acts a matrix material in which the particles of the first metal oxide 110 are dispersed. Therefore, in order to further improve the light extraction efficiency of a light extraction substrate 100 which is fabricated according to this embodiment, it is preferred that the first metal oxide 110 and the second metal oxide 120 be implemented as different metal oxides such that the first metal oxide 110 and the second metal oxide 120 have different refractive indices.

In addition, at the mixing step S1, the organic solvent 130 can be implemented as an ethanol solution which contains first and second organic matters. The first organic matter can be implemented as ethylene glycol (EG), and the second organic matter can be implemented as polyvinylphenol (PVP). For instance, the organic solvent can be composed of 10 ml ethanol and 0.2 g ethylene glycol and polyvinylphenol. Ethylene glycol and polyvinylphenol, i.e. the organic matters, serve to increase the dispersibility of the first metal oxide 110, thereby preventing the particles of the first metal oxide 110 from forming a bilayer at the subsequent process of the first coating step S2. This can consequently contribute to an increase in the flatness of the final metal oxide thin film 150. The organic solvent 130 made of the organic matter as described above is entirely lost in the subsequent heat treatment process.

At the mixing step S1, the first metal oxide 110, the sol of the second metal oxide 120 and the organic solvent 130 that are prepared as above can be mixed at a volumetric ratio of 1:1:2.

Afterwards, the first coating step S2 is the step of coating a base substrate 140 with the mixture including the first metal oxide 110, the second metal oxide 120 and the organic solvent 130 that is prepared at the mixing step S1. The first coating step S2 can coat the base substrate 140 with the mixture by spin coating or bar coating. When the metal oxide thin film 150 fabricated according to this embodiment is applied as an internal light extraction layer of an OLED, the base substrate 140 serves as an encapsulation substrate that protects the OLED from external environment. The base substrate 140 can be implemented as any transparent substrate that has superior light transmittance and mechanical properties. For instance, the base substrate 140 can be made of a polymeric material, such as a thermally or ultraviolet (UV) curable organic film, or a chemically strengthened glass, such as soda-lime glass ($SiO_2$—CaO—$Na_2O$) or aluminosilicate glass ($SiO_2$—$Al_2O_3$—$Na_2O$). When the OLED that employs the metal oxide thin film 150 according to this embodiment as the internal light extraction layer is used for illumination, the base substrate 140 can be made of soda-lime glass. When the OLED is used for display, the base substrate 140 can be made of aluminosilicate glass.

According to this embodiment, the base substrate 140 can be implemented as a thin glass having a thickness of 1.5 mm or less. The thin glass can be made by a fusion process or a floating process.

After the first coating step S2 of forming the coating film on the base substrate 140, a step of drying the resultant structure, for example, at 100° C. for 10 minutes can be carried out before the subsequent heat treatment step S3.

Figure 3:
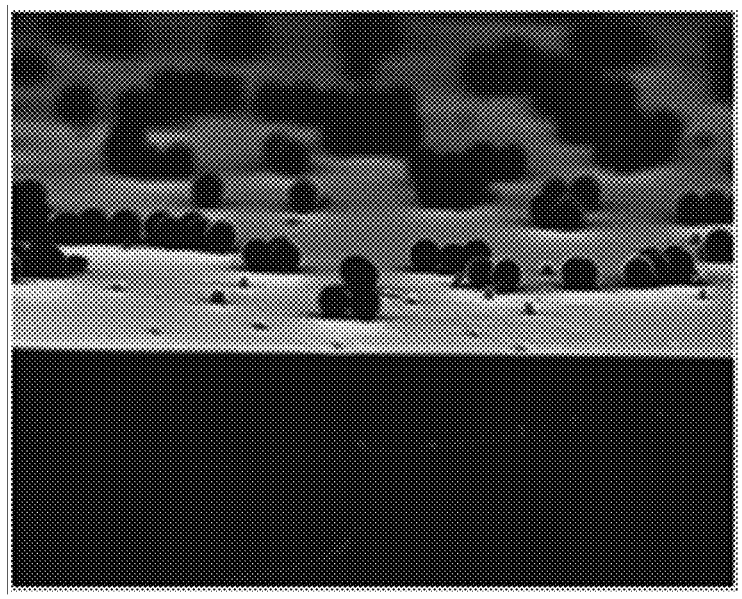
FIG. 3 is a scanning electron microscope (SEM) picture taken from the surface of a substrate after the heat treatment in the method of fabricating a light extraction substrate for an OLED according to an embodiment of the present invention.

After that, the heat treatment step S3 of heat-treating the coating film formed on the substrate 140 is carried out. At the heat treatment step S3, the coating film can be heat-treated at 500° C. for 30 minutes. As shown in a scanning electron microscope (SEM) picture of FIG. 3, when the coating film is heat-treated under the temperature conditions as defined above, the organic solvent 130 is lost, and thus the volume of the coating film except for the particles of the first metal oxide 110 is reduced. Consequently, the particles of the first metal oxide 110 are positioned on the base substrate 140 so as to be exposed, and the second metal oxide 120 forms a bottom surface of the coating film. According to this embodiment, after the heat treatment step S3, the second metal oxide 120 serves to affix the particles of the metal oxide 110 to the top of the base substrate 140.

As all of the organic matter and the organic solvent 130 are lost through the heat treatment step S3, none of the organic matter and the organic solvent 130 acts as a byproduct during the fabrication or operation of the OLED. Consequently, the organic matters used in the fabrication of the light extraction substrate according to this embodiment do not have any effect on the characteristics or longevity of the OLED.

Finally, the second coating step S4 is the step of coating the coating film with the second metal oxide 120 that serves as a matrix of the first metal oxide 110. At the second coating step S4, first, a sol of the second metal oxide 120 with an organic solvent. The organic solvent can be implemented as ethanol. The mixing ratio between the sol of the second metal oxide 120 and ethanol can be controlled so as to be 1:0.9.

As such, the second coating step S4 coats the coating film with the sol of the second metal oxide 120 to which ethanol is added by spin coating or bar coating as in the first coating S2. In this case, the matrix material of the second metal oxide 120 is absorbed between the particles of the first metal oxide 110 dispersed over the base substrate 140 by capillarity and surface tension, so that a very uniform coating can be consequently obtained.

Figure 4:
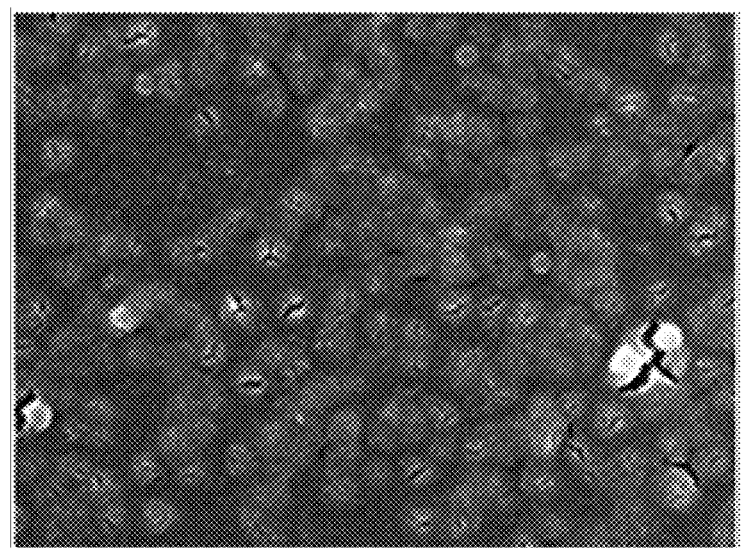
FIG. 4 is a scanning electron microscope (SEM) picture taken from the surface of the substrate after the second coating step in the method of fabricating a light extraction substrate for an OLED according to an embodiment of the present invention.

As the second coating step S4 is carried out in this manner, as shown in the SEM picture of FIG. 4, the metal oxide thin film 150 in which the particles of the first metal oxide 110 are impregnated in the matrix of the second metal oxide 120 is formed on the base substrate 140. The metal oxide thin film 150 formed in this manner constitutes the light extraction substrate 100 for an OLED together with the base substrate 140.

Figure 5:
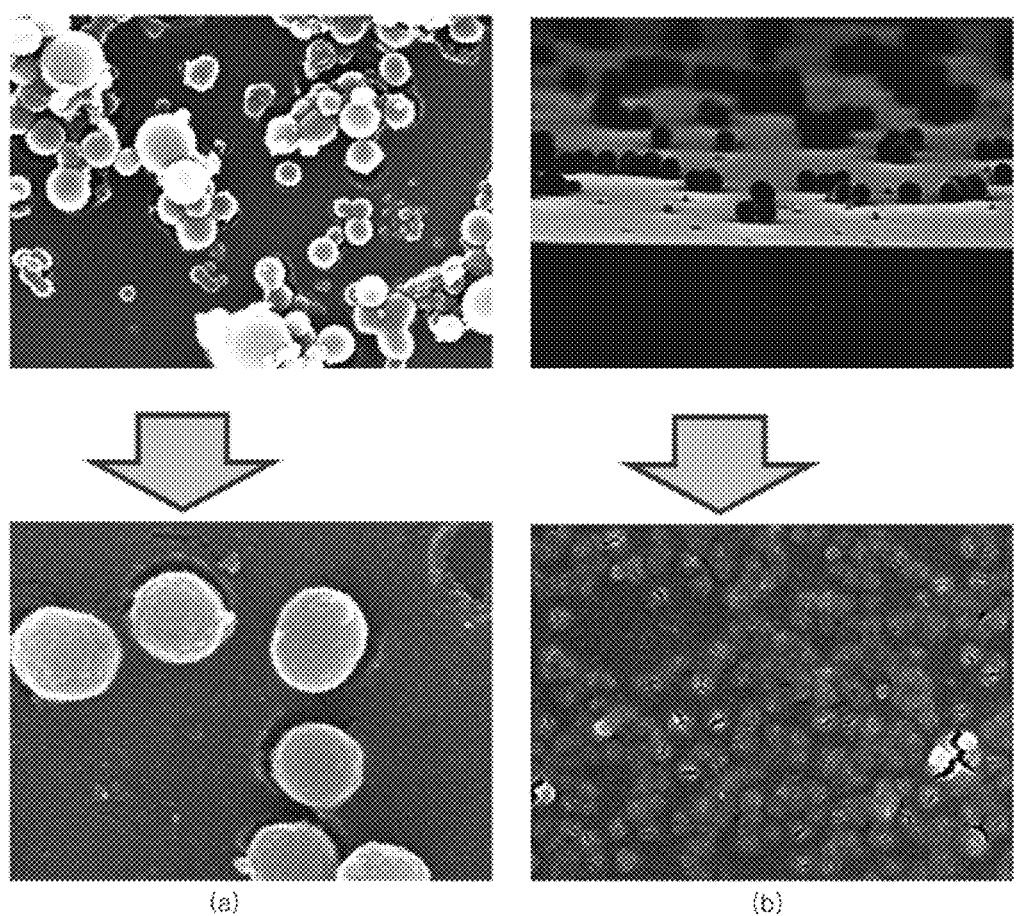
FIG. 5 is SEM pictures comparing surface conditions at respective steps of the method of fabricating a light extraction substrate for an OLED according to an embodiment of the present invention with those of a conventional method.

FIG. 5 is SEM pictures comparing surface conditions at respective steps of the method of fabricating a light extraction substrate for an OLED according to an embodiment of the present invention with those of a conventional method. In a conventional example (a), first coating was carried out without using ethylene glycol and polyvinylphenol, and second coating was carried out by mixing ethanol to a sol $TiO_2$. The surface roughness Rpv after the first coating was measured to range from 400 to 600 nm, and the surface roughness after the second coating was also measured to range from 400 to 600 nm. It was observed that there was substantially no change in the surface roughness after the second coating. In contrast, in an example of the present invention (b), the surface roughness Rpv after the first coating was measured to range from 60 to 250 nm, which was an improvement over that of the first coating of the conventional example. After the second coating, the surface roughness Rpv was measured to range from 75 to 80 nm, which explains that the surface roughness of the second coating was further improved over that of the first coating.

Figure 6:
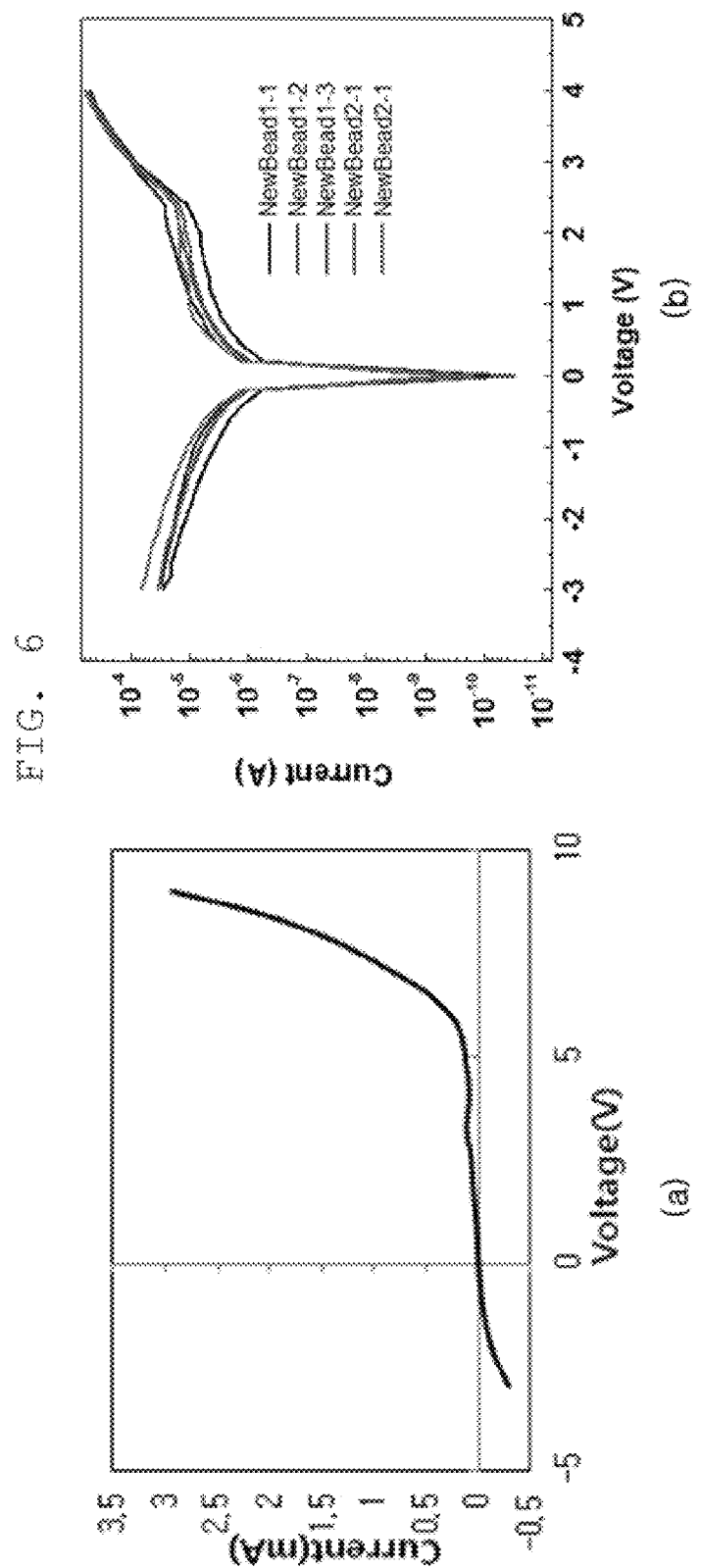
FIG. 6 is graphs comparing a leakage current of an OLED to which a light extraction substrate fabricated by the method of fabricating a light extraction substrate for an OLED according to an embodiment of the present invention with that of an OLED to which a light extraction substrate fabricated by a conventional method.

It was also confirmed that the success rate of the fabrication of an OLED by the stepwise coating as in this example of the present invention was increased to be at least 10 times as high as that by one-time coating of the base substrate with a mixture consisting of scattering particles and a matrix material as in the conventional example. As shown in FIG. 6, an OLED to which a light extraction layer fabricated by the method of fabricating a light extraction substrate for an OLED according to an embodiment of the present invention is applied exhibits a significant reduction in the leakage current compared to that of an OLED to which a light extraction substrate fabricated by a conventional method is applied.

When the light extraction substrate is fabricated by the method of fabricating a light extraction substrate according to an embodiment of the present invention, the surface flatness is increased, and thus the light extraction substrate can be used not only as an external light extraction layer but also as an internal light extraction layer.

Figure 7:
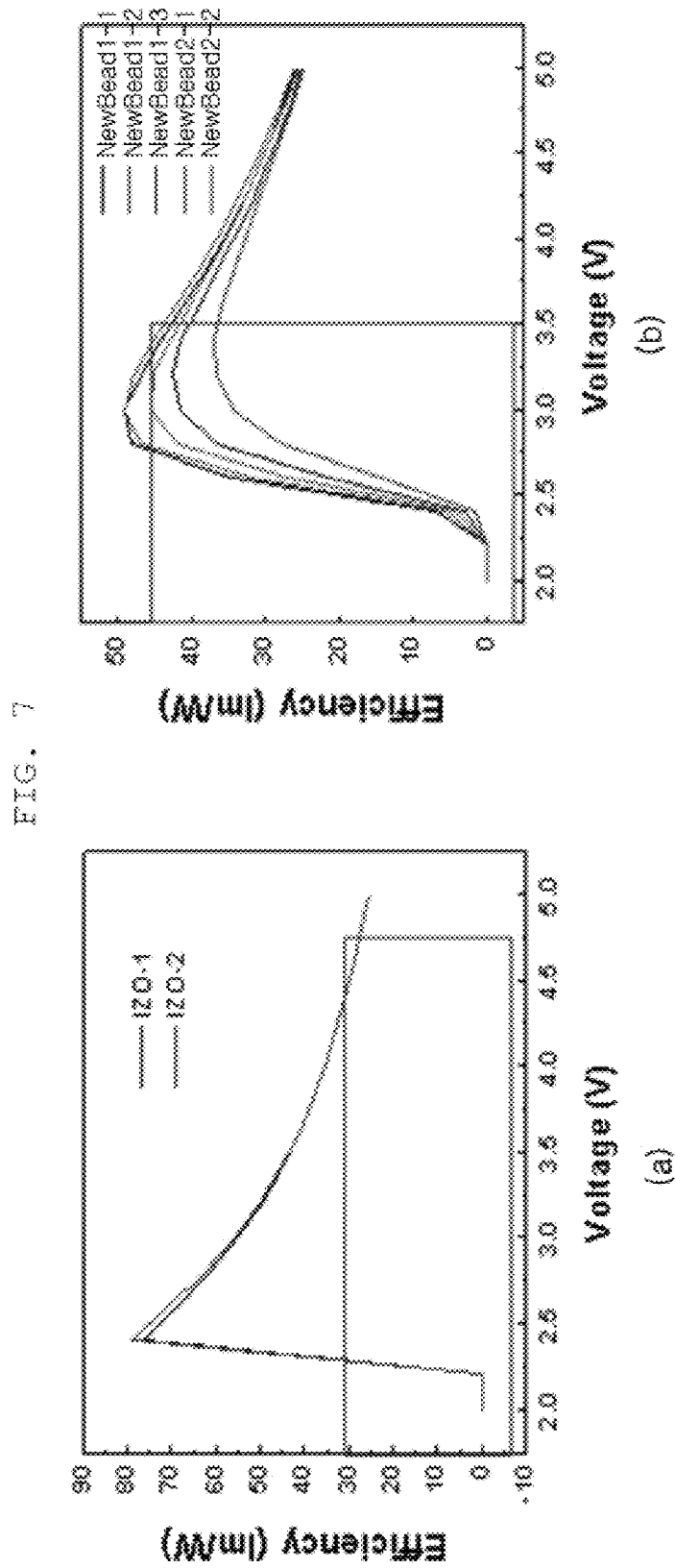
FIG. 7 is graphs comparing the light extraction efficiency of an OLED to which a light extraction substrate fabricated by the method of fabricating a light extraction substrate for an OLED according to an embodiment of the present invention is applied with that of an OLED to which a light extraction substrate fabricated by a conventional method is applied.
Figure 8:
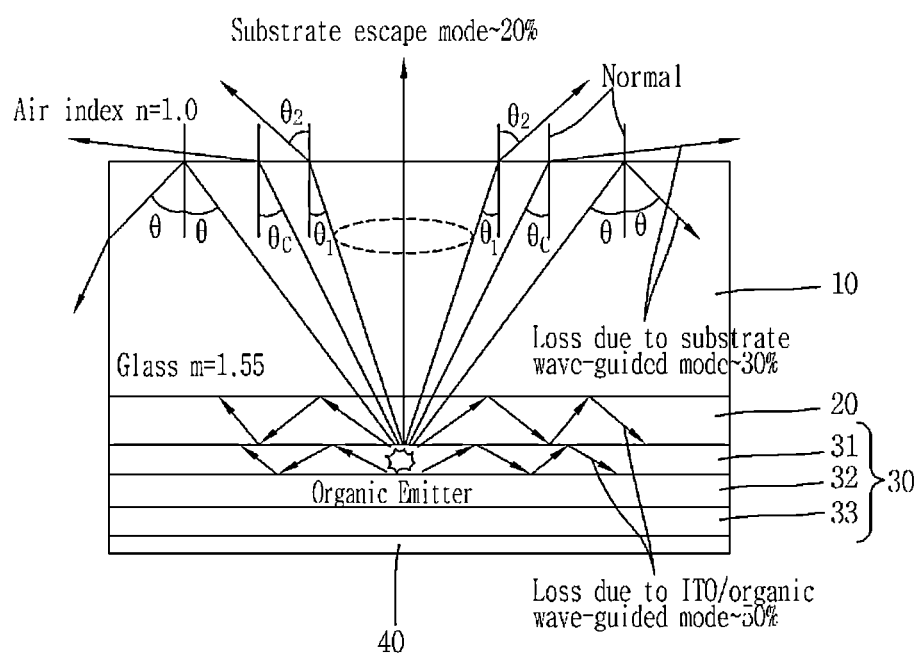
FIG. 8 is a conceptual view depicting the cross-section of a conventional OLED and the light extraction efficiency thereof.

In addition, FIG. 7 is graphs comparing the light extraction efficiency of an OLED to which a light extraction substrate fabricated by the method of fabricating a light extraction substrate for an OLED according to an embodiment of the present invention is applied with that of an OLED to which a light extraction substrate fabricated by a conventional method is applied. It was confirmed that the OLED to which the light extraction substrate fabricated by the method according to an embodiment of the present invention is applied (b) can achieve an improvement of about 55% or greater in the light extraction efficiency compared to the OLED to which the conventional method is applied (a).

As set forth above, when the light extraction substrate fabricated by the method of fabricating a light extraction substrate for an OLED according to an embodiment of the present invention is applied as an internal light extraction substrate of an OLED, it is possible to increase the light extraction efficiency of the OLED, and thus operate the OLED at a low current, thereby increasing the longevity of the OLED.

The foregoing descriptions of specific exemplary embodiments of the present invention have been presented with respect to the drawings. They are not intended to be exhaustive or to limit the present invention to the precise forms disclosed, and obviously many modifications and variations are possible for a person having ordinary skill in the art in light of the above teachings.

It is intended therefore that the scope of the present invention not be limited to the foregoing embodiments, but be defined by the Claims appended hereto and their equivalents.

What is claimed is:

1. A method of fabricating a light extraction substrate for an organic light-emitting device, comprising:
   inputting and mixing particles of a first metal oxide and a sol of a second metal oxide into an organic solvent;
   coating a base substrate with a first mixture of the particles of the first metal oxide, the sol of the second metal oxide and the organic solvent;
   heat-treating a resultant coating film on the base substrate; and
   coating the coating film with the second metal oxide to form a metal oxide thin film on the base substrate, wherein, in the metal oxide thin film, a matrix of the second metal oxide is impregnated with the particles of the first metal oxide.

2. The method according to claim 1, wherein the organic solvent comprises an ethanol solution in which a first organic matter and a second organic matter are included.

3. The method according to claim 2, wherein one of the first and second organic matters comprises ethylene glycol, and the other one of the first and second organic matters comprises polyvinylphenol.

4. The method according to claim 1, wherein the first metal oxide comprises one selected from the group consisting of ZnO, $Al_2O_3$, $TiO_2$, $SnO_2$, $ZrO_2$ and $SiO_2$.

5. The method according to claim 1, wherein the particles of the first metal oxide which is dispersed in ethanol are used to be mixed with the sol of the second metal oxide and the organic solvent.

6. The method according to claim 1, wherein the second metal oxide comprises a material identical with or different from that of the first metal oxide.

7. The method according to claim 6, wherein the second metal oxide comprises one selected from the group consisting of ZnO, $Al_2O_3$, $TiO_2$, $SnO_2$, $ZrO_2$ and $SiO_2$.

8. The method according to claim 1, wherein the first mixture comprises the first metal oxide, the sol of the second metal oxide and the organic solvent at a volumetric ratio of 1:1:2.

9. The method according to claim 1, wherein coating the base substrate with the first mixture comprises coating the base substrate with the first mixture by spin coating or bar coating.

10. The method according to claim 1, wherein coating the coating film with the second metal oxide comprises mixing the second metal oxide with another organic solvent and then coating the coating film with a second mixture of the second metal oxide and the another organic solvent.

11. The method according to claim 10, wherein coating the coating film with the second metal oxide comprises coating the coating film with the second metal oxide by spin coating or bar coating.

12. The method according to claim 1, further comprising drying the coating film before heat-treating the coating film on the base substrate.

* * * * *